United States Patent
Mathai et al.

(10) Patent No.: US 8,873,893 B2
(45) Date of Patent: Oct. 28, 2014

(54) NANO-WIRE OPTICAL BLOCK DEVICES FOR AMPLIFYING, MODULATING, AND DETECTING OPTICAL SIGNALS

(75) Inventors: Sagi Varghese Mathai, Berkeley, CA (US); Shih-Yuan Wang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 815 days.

(21) Appl. No.: 13/002,884

(22) PCT Filed: Jul. 31, 2008

(86) PCT No.: PCT/US2008/071780
§ 371 (c)(1),
(2), (4) Date: Jan. 6, 2011

(87) PCT Pub. No.: WO2010/014099
PCT Pub. Date: Feb. 4, 2010

(65) Prior Publication Data
US 2011/0123146 A1    May 26, 2011

(51) Int. Cl.
| | |
|---|---|
| *G02F 1/01* | (2006.01) |
| *H01L 31/0352* | (2006.01) |
| *H01L 31/105* | (2006.01) |
| *G02B 6/10* | (2006.01) |
| *B82Y 20/00* | (2011.01) |
| *H01S 5/34* | (2006.01) |
| *H01S 5/50* | (2006.01) |
| *H01S 5/10* | (2006.01) |

(52) U.S. Cl.
CPC ........ *H01S 5/341* (2013.01); *H01L 31/035236* (2013.01); *H01L 31/105* (2013.01); *G02B 6/107* (2013.01); *H01S 5/5018* (2013.01); *B82Y 20/00* (2013.01); *H01S 5/5036* (2013.01); *H01S 5/10* (2013.01); *H01L 31/035227* (2013.01); *H01S 5/50* (2013.01)
USPC ............................................................. 385/1

(58) Field of Classification Search
USPC ............................................................. 385/1
See application file for complete search history.

(56) References Cited

U.S. PATENT DOCUMENTS

| | | | |
|---|---|---|---|
| 7,435,996 | B2 | 10/2008 | Jin et al. |
| 7,439,560 | B2 | 10/2008 | Shioya et al. |

(Continued)

FOREIGN PATENT DOCUMENTS

| | | |
|---|---|---|
| CN | 1722480 A | 1/2006 |
| JP | 2005-516253 | 6/2005 |

(Continued)

OTHER PUBLICATIONS

Search Report (English Translation), Jul. 4, 2012, State Intellectual Property Office of People's Republic China, CN Patent Application No. 200880130639.4.

(Continued)

*Primary Examiner* — Uyen Chau N Le
*Assistant Examiner* — Hoang Tran

(57) ABSTRACT

A nano-wire optical block device for amplifying, modulating, and detecting an optical signal in a large-core hollow metallized waveguide. The nano-wire optical block device comprises a substrate with a plurality of nano-wires coupled to the substrate to form the nano-wire optical block. Each properly formed nano-wire is comprised of a p-doped region, an intrinsic region, and an n-doped region. The nano-wire optical block is operable to be inserted into the large-core hollow metallized waveguide to provide at least one of amplifying, modulating, and detecting the optical signal.

17 Claims, 6 Drawing Sheets

(56) References Cited

U.S. PATENT DOCUMENTS

| | | | |
|---|---|---|---|
| 7,919,786 B2 * | 4/2011 | Jin et al. ........................ | 257/98 |
| 2002/0172820 A1 | 11/2002 | Majumadar et al. | |
| 2003/0035613 A1 | 2/2003 | Huber et al. | |
| 2005/0227391 A1 * | 10/2005 | Jin et al. ........................ | 438/22 |

FOREIGN PATENT DOCUMENTS

| | | |
|---|---|---|
| JP | 2005-227707 | 8/2005 |
| JP | 17227707 | 8/2005 |
| JP | 2007-500370 | 1/2007 |
| JP | 2007-041470 | 2/2007 |
| JP | 2007-043150 | 2/2007 |
| JP | 2007-184566 | 7/2007 |
| KR | 10-2005-0098539 | 10/2005 |
| WO | WO-2008/072479 | 6/2008 |

OTHER PUBLICATIONS

Supplemental Search Report (English Translation), Apr. 9, 2013.
State Intellectual Property Office of People's Republic China, CN Patent Application No. 200880130639.4.
PCT Search Report and Written Opinion for International Patent Application No. PCT/US2008/071780.

* cited by examiner

NANO-WIRE OPTICAL BLOCK DEVICES FOR AMPLIFYING, MODULATING, AND DETECTING OPTICAL SIGNALS

BACKGROUND

As computer chip speeds on circuit boards increase to ever faster speeds, a communications bottleneck in inter-chip communication is becoming a larger problem. One likely solution is to use optics to interconnect high speed computer chips. However, most circuit boards involve many layers and often require tolerances in their manufacture of less than a micron. Physically placing fiber optics and connecting the fibers to the chips can be too inaccurate and time consuming to be widely adopted in circuit board manufacturing processes.

Additionally, accessing optical signals in a solid core optical waveguide at multiple locations can be challenging. Each time an optical signal is accessed it can interfere with and degrade the original signal. Marketable optical interconnects between chips have therefore proven illusive, despite the need for broadband data transfer.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Reference will now be made to the exemplary embodiments illustrated, and specific language will be used herein to describe the same. It will nevertheless be understood that no limitation of the scope of the invention is thereby intended.

DETAILED DESCRIPTION OF EXAMPLE EMBODIMENTS

One method for forming optical interconnects between computer chips on a circuit board is to use optical waveguides formed on the circuit board. Optical waveguides can be superior to fiber optic communications for interconnecting electronics because of the ability to form the waveguides on the circuit board using lithographic or similar processes. The waveguides are typically formed on the circuit boards with substantially optically transparent material, such as polymers and/or dielectrics. Optical waveguides made using lithographic or similar processes can also be formed on other types of substrates that are not mounted on a circuit board. For example, optical waveguide(s) may be formed on a flexible substrate to create a ribbon cable having one or more optical waveguides. The optical waveguides disclosed in this application are formed on substrates using lithographic or similar processes.

Forming optical waveguides in this fashion can provide interconnects that are constructed with the necessary physical tolerances to be used on modern multi-layer circuit boards. However, the polymers, dielectrics, and other materials that can be used in chip and circuit board manufacture to form the on-board waveguides are typically significantly more lossy than fiber optics. Indeed, the amount of loss in on-board waveguides has been one of the factors limiting the acceptance of optical waveguide interconnects. Polymers used to construct the waveguides can have a loss of 0.1 dB per centimeter. In contrast, the loss in a fiber optic is around 0.1 dB per kilometer. Thus, polymer waveguides can have losses that are orders of magnitude greater than the loss in fiber optics.

In addition, typical waveguides are usually manufactured to have dimensions that are roughly proportional with the wavelength of light they are designed to carry. For example, a single mode waveguide configured to carry 1000 nm light may have its largest dimension of 1000 nm to 5000 nm (1 μm to 5 μm). Connecting waveguides of this size can be expensive and challenging. The cost of creating and connecting waveguides has historically reduced their use in most common applications. Multimode waveguides may have larger dimensions on the order of 20-60 μm for the core region. Both single and multimode waveguides have a relatively high numerical aperture (NA) of around 0.2 to 0.3 for a core and clad refractive index contrast of 0.01 to 0.02. The numerical aperture determines the divergence of beam from the emitting fiber. Thus, a larger NA will result in poor coupling as a function of fiber to fiber separation. Splitting and tapping of the guided optical beams are also difficult to accomplish using these waveguides.

Figure 1:
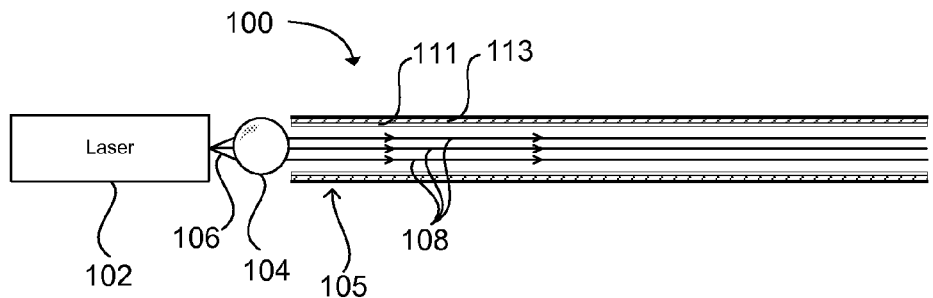
FIG. 1 is an illustration of a large core hollow metallized waveguide in accordance with an embodiment of the present invention.

A substantial improvement over traditional optical waveguides that are formed using polymers or dielectric materials is the use of a large core hollow waveguide 100 configured to guide coherent light 108, as shown in FIG. 1. The large core hollow waveguide can have a diameter (or width and/or height) on the order of 50 to 150 or more times a wavelength of the coherent light the waveguide is configured to guide. The large core hollow waveguide can have a cross-sectional shape that is square, rectangular, round, elliptical, or some other shape configured to guide an optical signal. Furthermore, because the waveguide is hollow, the light essentially travels at the speed of light in air or a vacuum.

FIG. 1 illustrates a light source, typically a laser or light emitting diode, 102 emitting a multi mode beam 106 into a waveguide 105. The multi mode beam may bounce between the walls of the waveguide. At each reflection, a substantial loss of the beam may occur. In order to decrease loss within the waveguide, a reflective coating 113 may be added to cover an interior of the hollow waveguide 100. The reflective coating can be formed using a plating, sputtering, or similar process, as can be appreciated. If the hollow waveguide comprises a polymer or other material with a low melting point, the reflective coating may be applied using a low temperature process such as sputtering, electroplating or thermal evaporation.

The reflective coating 113 can be comprised of one or more layers of metal, dielectrics, or other materials that are substantially reflective at the wavelength of the coherent light. The metals can be selected based on their reflectivity. A highly reflective layer covering the channel is desired. For example, the reflective layer may be formed using silver, gold, aluminum, or some other metal or alloy that can form the highly reflective layer.

Alternatively, the reflective coating 113 may be a dielectric stack which can be formed from one or more layers of dielectric material that is substantially reflective at a selected wavelength. Before the reflective coating is deposited, the uncoated hollow channel may be subject to a heat reflow to smooth out any surface roughness. The reflective coating may also undergo a heat reflow or similar process to smooth surface roughness in the reflective layer that may occur during the deposition process. Electro-polishing may also be used to smooth out the reflective metal surface. The large core hollow waveguide with the reflective coating is referred to as a large core hollow metallized waveguide.

If the photonic guiding device is not hermetically sealed, the reflective coating 113 may oxidize over time. Oxidation of the reflective coating can substantially reduce its reflectivity. To reduce or eliminate degradation of the metal coating's reflectivity, a protective layer 111 can be formed over the reflective coating. The protective layer can comprise a material that is substantially transparent at the wavelength of the coherent light. For example, the protective layer can be formed of silicon dioxide or some other material that can form a substantially air tight bond over the reflective coating. This protective layer will also reduce the propagation loss by further separating the propagating light from the lossy reflective layer.

Hollow waveguides having reflective surfaces operate differently than solid waveguides. Hollow waveguides work using the principle of attenuated total internal reflection guiding light through reflection from the reflective layer(s) and not through total internal reflection between a higher index core region and a lower index cladding region, as typically occurs in solid waveguides such as an optical fiber. The light within the hollow waveguide may be reflected at larger angles of incidence than what is necessary for total internal reflection, as can be appreciated.

For a circular hollow waveguide, the $TE_{01}$ mode has an attenuation per unit length that can be determined according to equation 1:

$$\alpha_c = \frac{R_s}{a\eta} \cdot \frac{(\omega_c/\omega)^2}{\sqrt{1-(\omega_c/\omega)^2}}, \qquad (1)$$

where $\alpha$ is the waveguide radius, $\omega$ is the frequency of the light in radians, $\omega_c$ is the $TE_{0}$, cut-off frequency, and $\eta$ is the impedance of free space. The attenuation in the hollow waveguide is due to the finite conductivity of the metal walls. $R_s$ is the surface resistivity of the metal and is given by:

$$R_s = \frac{1}{\sigma\delta} = \sqrt{\frac{\pi f \mu}{\sigma}}, \qquad (2)$$

where $\sigma$ is the conductivity, $f$ is frequency of light, $\delta$ is the depth of penetration of the light into the metal, and $\mu$ is the permeability of the metal. It can be seen that $R_s$ increases as the square root of $f$.

From equation (1) above, it can be seen that the attenuation for the $TE_{01}$ mode decreases with increasing frequency. The decrease in attenuation at increasing frequencies occurs because the mode is not coupled to the guide walls at high frequencies.

There are also higher order modes which exist in the hollow metal waveguide 100. However, these modes are very lossy since they are more coupled to the metal walls (i.e. they suffer more reflection due to their higher numerical aperture). At waveguide bends and discontinuities the TE01 mode will be attenuated due to mode conversion to the higher order modes. The lowest loss mode can be described by a set of rays which only graze the reflective wall at a steep angle from the normal resulting in a fewer number of bounces as it propagates down the waveguide. For this reason, the low loss mode has a very small numerical aperture as compared to conventional solid core waveguides.

Ideally, a single mode laser is typically used to direct coherent light into a hollow waveguide. However, single mode lasers can be relatively expensive. It has been discovered that a less expensive, multi-mode laser such as a vertical-cavity surface-emitting laser (VCSEL) can be useful in communicating high data rate signals through relatively short distances using hollow waveguides having reflective inner surfaces. For example, multi-mode lasers can be used to direct high data rate signals through large core hollow reflective waveguides used as inter-chip and inter-circuit board connections. The use of multi-mode lasers can significantly decrease the cost of optical interconnects, enabling their use to interconnect a much wider variety of electronic devices. However, multi-mode laser output can have significantly greater losses when directly coupled to a hollow metal waveguide.

To overcome the attenuation of the higher modes emitted from a multi-mode laser 102, a collimator 104 can be placed within a path of the multi-mode light rays 106 emitted from the laser. The collimator can be a collimating lens or series of lenses. In one embodiment, the collimator can be configured as a ball lens. The ball lens can have an anti-reflective coating.

The collimator 104 is configured to collimate the multi-mode beam to cause a plurality of the multiple modes, or rays 106 emitted from the laser 102 to form a collimated beam 108 in which the multiple modes travel substantially in parallel within the large core hollow waveguide 200. Collimation of the multi-mode beam can be used to efficiently couple the multimode laser to the low loss mode of the hollow metal waveguide by launching rays which are nearly parallel to the waveguide, substantially reducing the number of reflections that occur within the waveguide. Reflections of the collimated beam that do occur within the waveguide will typically be at a relatively shallow angle with respect to the waveguide walls, thus minimizing the number of reflections within the waveguide and therefore reducing the attenuation of the light within the hollow waveguide.

Additionally, a diameter of the beam may be condensed by the collimator to underfill the waveguide. In other words, the collimated beam can have a diameter that is less than a diameter, width, or height of the waveguide. Condensing the collimated beam to underfill the waveguide can reduce the interaction of the outer modes or rays with the reflective coating on an interior of the hollow large core waveguide and also allow for larger misalignment tolerance.

Even with the coherent beam 108 collimated and condensed to underfill the large core hollow waveguide 100, a width or diameter of the beam can fill a substantial portion of the waveguide. For example, the collimated beam may have a diameter that is greater than half a width of the waveguide. The width of the multi-mode collimated beam, relative to a single-mode beam, can reduce the misalignment tolerances of the multi-mode beam within the waveguide.

For example, a coherent multimode beam of 850 nm light can be transmitted through a 150 µm large core waveguide having a reflective coating with a loss on the order of 0.07 dB/cm. The numerical aperture of the light exiting the waveguide was determined to be less than 0.05. The losses of the waveguide can scale with its size. Smaller size waveguides have higher losses due to the greater number of internal reflections (bounces) in the waveguide. Thus, larger waveguides may be used to reduce loss.

Significant losses can occur within a waveguide 100 if the optical pathway through the waveguide is not substantially straight. Bends or turns that occur in the waveguide can cause the light to have an unwanted number of bounces, causing a substantial amount of attenuation. To enable optical signals to be routed in a different direction, mirrors, splitters, and lenses can be used. However, each of these components can also cause losses and degradation of the optical signal 108. These losses may become significant over a relatively substantial length of the waveguide. The losses may also become significant if a large number of optical devices such as splitters are used to remove or redirect optical signals at multiple locations in the waveguide.

In accordance with one aspect of the present invention, it has been recognized that an inexpensive photonic device is needed that can be inserted into a hollow metal waveguide 100 that can amplify the optical signal 108 to allow the signal to travel a greater distance and/or to enable additional optical components such as splitters, lenses, and mirrors to be used while allowing the optical signal to maintain a desired power level within the hollow metal waveguide.

In one embodiment of the invention, a nano-wire optical block device 200 for amplifying, modulating, and detecting an optical signal can be configured to be inserted into a large-core hollow metal waveguide, as shown in the exemplary embodiments illustrated in FIGS. 2a, 2b and 2d-2h. Each nano-wire optical block can be comprised of a substrate material 202 and a plurality of active nano-wires 206 located in an active area 204 of the optical block. The nano-wire optical blocks can be sized to be inserted into the hollow metal waveguide 100.

The substrate 202 of the optical block can be comprised of an electrically conductive material such as single crystalline silicon, micro-crystalline silicon, amorphous silicon having short range crystal information, III-V material such as indium phosphide (InP), gallium arsenide (GaAs), gallium nitride (GaN) and the like. In one embodiment, the substrate can be formed of a material that is substantially optically transparent at a selected frequency. Alternatively, the substrate can be substantially removed from the active area 204 to allow light from the optical signal to interact with the nano-wires.

Figure 2A:
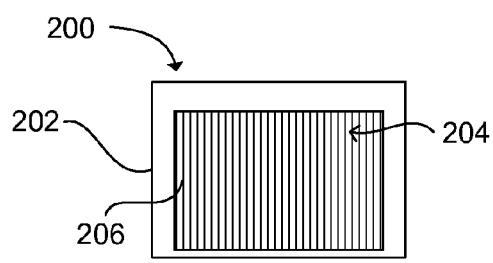
FIG. 2a is an illustration of a nano-wire optical block device with nano-wires oriented in a vertical direction in accordance with an embodiment of the present invention.
Figure 2B:
FIG. 2b is an illustration of a nano-wire comprised of a p-doped region, an intrinsic region, and an n-doped region.

Each properly formed nano-wire 206 can be formed of a III-V material such as GaAs, InP, GaN, and their alloys, with a diameter that is less than a wavelength of the optical signal in the hollow metal waveguide. The nano-wire can be configured as a PIN diode, with a p type region, a lightly doped intrinsic region, and an n type region, as illustrated in FIG. 2b. The PIN diode can be a homo-junction or a hetero-junction, in which case it will contain ternary and quaternary alloys of the III-V material family. The p-type and n-type regions are typically heavily doped for use as ohmic contacts with the conductive substrate 202. In one embodiment, the intrinsic region can act as a quantum well.

Figure 2C:
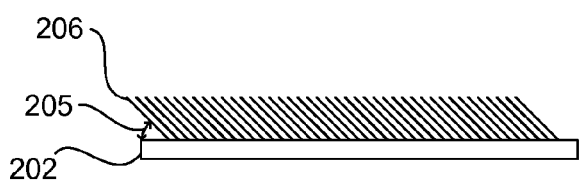
FIG. 2c is an illustration of a nano-wire optical block device showing the nano-wires having an off-axis orientation with respect to the substrate in accordance with an embodiment of the present invention.
Figure 2D:
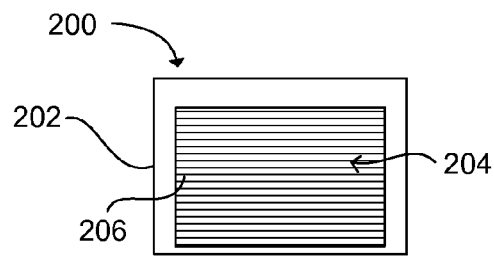
FIG. 2d is an illustration of a nano-wire optical block device with nano-wires oriented substantially in a horizontal direction in accordance with an embodiment of the present invention.
Figure 2E:
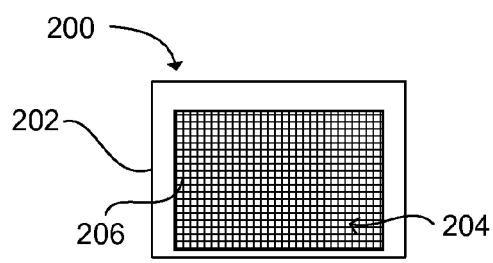
FIG. 2e is an illustration of a nano-wire optical block device with nano-wires substantially in vertical and horizontal directions in accordance with an embodiment of the present invention.
Figure 2F:
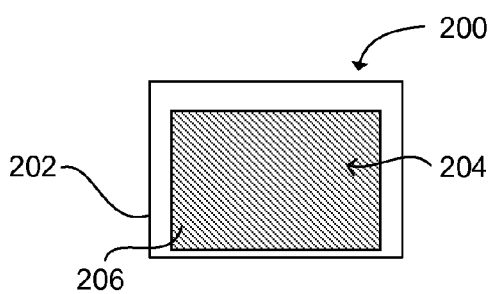
FIG. 2f is an illustration of a nano-wire optical block device with nano-wires set at an angle in accordance with an embodiment of the present invention.
Figure 2G:
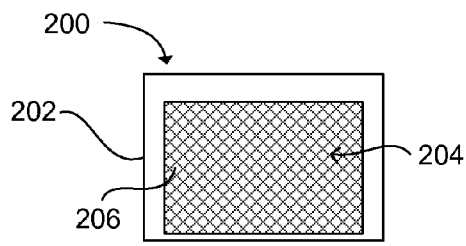
FIG. 2g is an illustration of a nano-wire optical block device with substantially randomly aligned nano-wires in accordance with an embodiment of the present invention.
Figure 2H:
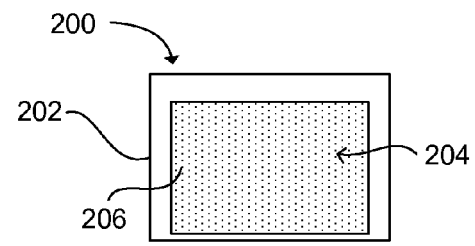
FIG. 2h is an illustration of a nano-wire optical block device with nano-wires formed substantially orthogonal to a substrate in accordance with an embodiment of the present invention.

Forward biasing the nano-wires 206 in the optical block provides gain to photons interacting with the nano-wire. Each properly formed nano-wire can behave as a miniature semiconductor optical amplifier, amplifying the photons in the optical signal within the hollow metal waveguide. The nano-wires may be aligned with a specific alignment relative to the substrate 202. Each nano-wire may also be off-axis from the substrate by a selected angle 205 that may by tens of degrees relative to the substrate, as illustrated in FIG. 2c. The selected angle can be chosen to provide a desired level of interaction between the photons in the waveguide 100 (FIG. 1) and the nano-wires. The nano-wires, whether on-axis (flush with the substrate) or off-axis (directed away from the substrate at a selected angle) may also be aligned in a specific direction, such as horizontally (FIG. 2a), vertically (FIG. 2d), both horizontally and vertically (FIG. 2e), at a selected angle (FIG. 2f), in a substantially random manor (FIG. 2g), or perpendicular to the substrate (FIG. 2h). The perpendicular nano-wires may also be formed at a specific angle that is tens of degrees less than or greater than 90 degrees with respect to the optical axis of the waveguide 100.

A specific alignment of the nano-wires 206 with respect to the substrate 202 may be used when the optical signal 108 (FIG. 1) is polarized. For example, a horizontal or vertical alignment can enable a polarized optical signal to be amplified while retaining the selected polarization of the signal. Aligning the nano-wires can also provide a more efficient means for amplifying a polarized signal. Alternatively, a nano-wire block 200 having substantially randomly aligned nano-wires 206 may be more effective to amplify a polarization scrambled optical signal.

Figure 3A:
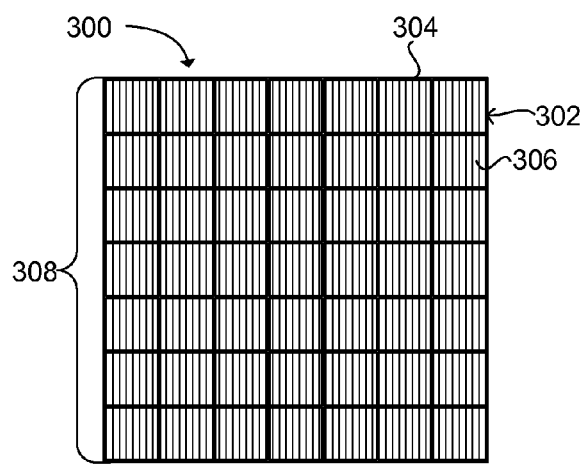
FIG. 3a is an illustration of a nano-wire optical block device with a nano-wire grid array with vertical nano-wires in accordance with an embodiment of the present invention.
Figure 3B:
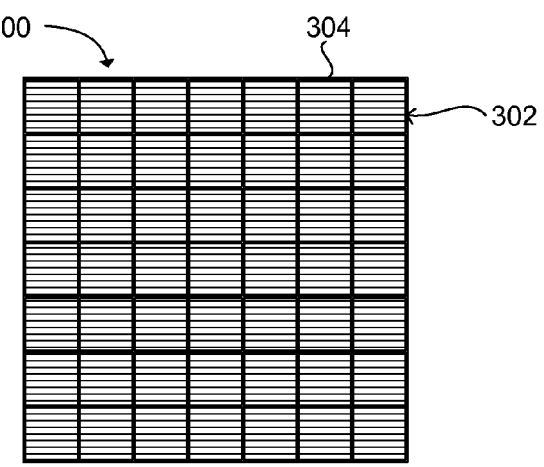
FIG. 3b is an illustration of a nano-wire optical block device with a nano-wire grid array with horizontal nano-wires in accordance with an embodiment of the present invention.
Figure 3C:
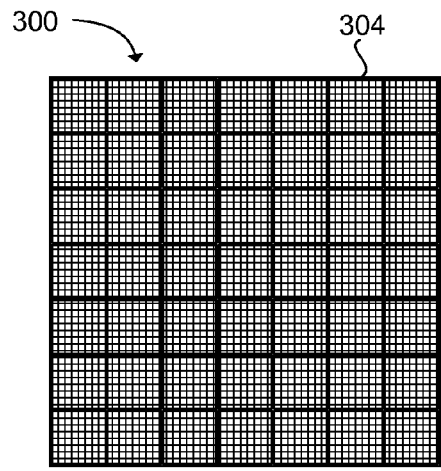
FIG. 3c is an illustration of a nano-wire optical block device with a nano-wire grid array with vertical and horizontal nano-wires in accordance with an embodiment of the present invention.

As previously discussed, a typical hollow metal waveguide 100 (FIG. 1) can have a height and a width of approximately 150 μm. However, forming nano-wires of that length may be difficult. Additionally, nano-wires having a relatively substantial length may be fairly fragile. To overcome these limitations, an optical block 300 may be formed having a nano-wire grid array, as illustrated in FIG. 3a. The grid array can be comprised of an array 308 of areas 302 in which nano-wires can be formed. Each area can include a box or frame 304 to which the nano-wires can be coupled to. The frame may be a box comprised of a substrate, such as the substrate 202 (FIG. 2a). The substrate may be substantially continuous, as shown in FIG. 2c, with the nano-wires directed out of the substrate at a selected angle. The frame can be configured to enable the nano-wires connected to the frame to be forward biased or reverse biased as desired. While the frame is shown as square in the exemplary embodiments illustrated in FIGS. 3a-3f, the frame may be substantially any shape, such as rectangular, round, triangle, honeycomb, or another polygon shape to which the nano-wires may be attached and biased.

In one embodiment, each area 302 in the grid array 308 can have dimensions of approximately 10 μm×10 μm. Each area in the grid can be spaced a distance from an adjacent area that is less than a wavelength of the light in the optical signal 108 (FIG. 1). A plurality of PIN diode nano-wires 306, having a diameter less than a wavelength of the light in the optical signal, can be formed in each area. The nano-wires can also be spaced apart at a distance that is substantially less than a wavelength of the light. For example, for an optical signal having a wavelength of 850 nm, each 10 μm×10 μm area may be comprised of a plurality of nano-wires having diameters from 10 nm to 100 nm. The nano-wires can be spaced a distance falling in the range 10 nm to 1000 nm from adjacent nano-wires. Each area 302 can be spaced a distance of less than 1 μm from adjacent areas in the grid array.

Figure 3D:
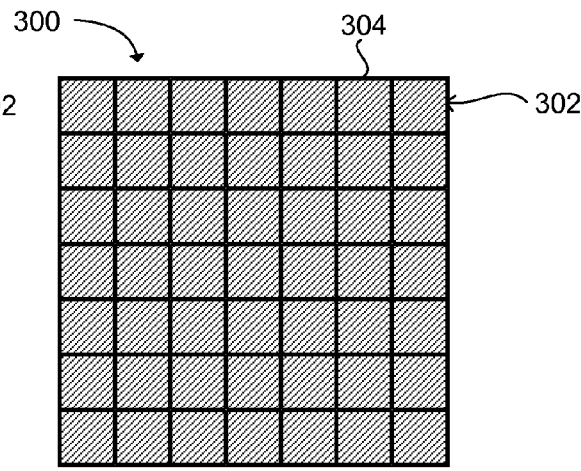
FIG. 3d is an illustration of a nano-wire optical block device with a nano-wire grid array with nano-wires set at an angle in accordance with an embodiment of the present invention.
Figure 3E:
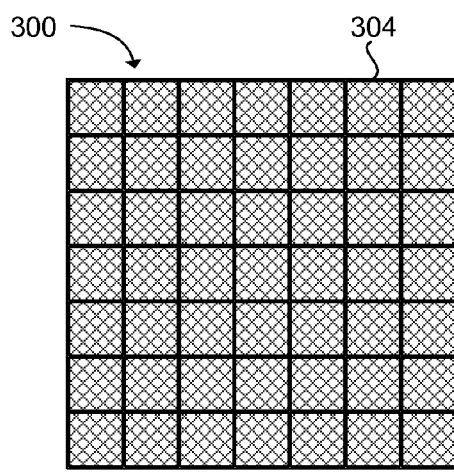
FIG. 3e is an illustration of a nano-wire optical block device with a nano-wire grid array with substantially randomly aligned nano-wires in accordance with an embodiment of the present invention.
Figure 3F:
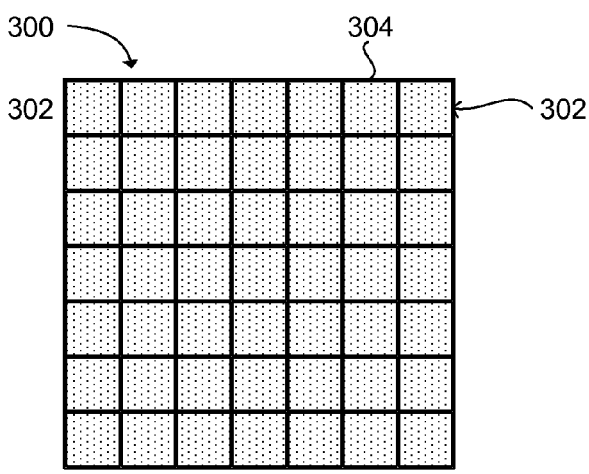
FIG. 3f is an illustration of a nano-wire optical block device with a nano-wire grid array with nano-wires formed substantially orthogonal to a substrate in accordance with an embodiment of the present invention.

Exemplary embodiments of optical blocks 302 comprising nano-wire grid arrays 308 are illustrated in FIGS. 3a-3f. As previously discussed in reference to FIGS. 2a-2h, the nano-wires may be oriented in a selected direction and tens of degrees off axis in a direction perpendicular to the substrate in each area 302 of the grid array comprising the optical block 300. The nano-wires can be oriented vertically (FIG. 3a), horizontally (FIG. 3b), vertically and horizontally (FIG. 3c), or at a selected angle with respect to the frame 304 in the grid array (FIG. 3d). Alternatively, the nano-wires may be oriented in a substantially random manner (FIG. 3e). The nano-wires may also be formed to be substantially perpendicular to the substrate (FIG. 3f) or at a selected angle relative to an optical axis of the waveguide 100, as previously discussed. In one embodiment, each area 302 in a selected grid array comprising an optical block 300 can have a substantially similar alignment of nano-wires. Alternatively, an optical block may include two or more different alignments in the areas that comprise the optical block.

In one embodiment, nano-wires 306 can be configured with different bandgap material so that the nano-wires in different areas 302 can be used to selectively detect signals of different wavelengths. For example, the nano-wire block 300 can include nano-wires having at least two different band gaps. Sufficient areas 302 can include nano-wires with a first band gap to absorb 20% of a first wavelength. Sufficient areas can include nano-wires having a second band gap to absorb 90% of a second wavelength in a multiplexed optical signal. Nano-wires having a plurality of different band gaps can be included in a nano-wire block to enable a coarse wavelength division multiplexed (CWDM) signal to be detected, amplified, and/or modulated.

Figure 4:
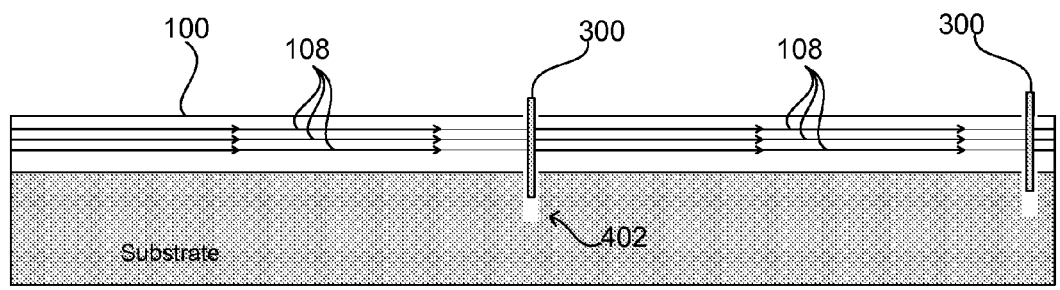
FIG. 4 is an illustration of a large core hollow metallized waveguide with nano-wire optical blocks inserted in slots in the waveguide in accordance with an embodiment of the present invention.

One or more nano-wire optical blocks, such as an optical block 300, as illustrated in FIGS. 3a-3f, can be inserted in a hollow metallized waveguide 100, as shown in FIG. 4. When the nano-wires are forward biased, as previously discussed, each area 302 (FIG. 3a) of properly formed nano-wires 306 can be used to amplify the optical signal 108. A plurality of nano-wire optical blocks can be inserted into a waveguide, so long as the signal to noise ratio of the amplified optical signal that is output from the nano-wire optical block is greater than a desired level.

A nano-wire optical block, such as the examples illustrated in FIGS. 2a and 2d-2h and 3a-3f can be configured to be inserted into a slot 402 formed in a hollow metallized waveguide 100, as shown in the exemplary embodiment of FIG. 4. In one embodiment, the slot can be formed at an angle that is approximately orthogonal to the optical signal path within the waveguide. However, proper alignment is not critical to the functioning of the optical block. The optical block may be misaligned by several degrees and still function substantially similarly to a device that is orthogonal to the optical signal path. Additionally, the optical block can be anti-reflection coated to eliminate back-reflections into the hollow metallized waveguide.

Use of the hollow metallized waveguide 100 enables the nano-wire optical block 300 to be inserted without substantial degradation of the optical signal 108 traveling through the waveguide. This is possible because the optical signal is traveling through a medium of air or a vacuum within the waveguide. In contrast, inserting an external device into a slot in a solid core waveguide, such as a fiber optic waveguide or polymer waveguide, can result in substantial degradation of an optical signal due to the change in refractive index between the fiber core and air or vacuum. Thus, the use of a large core hollow metallized waveguide enables the nano-wire optical block to be inserted into the slot 402 formed in the waveguide.

The nano-wire optical block 300 can be a so-called drop-in block that can be easily inserted for manufacture or test. The drop-in block can be inserted by hand, using an instrument, or using automated mechanical means such as a robotic system. The block can be rapidly set in the slot using, for example, adhesive. In contrast to solid waveguides, a small gap remaining in the hollow metal waveguide after the block has been inserted will not significantly degrade the optical signal. Hollow metal waveguides are typically quite tolerant of gaps. A gap in the waveguide of around a few tenths of a millimeter may exist without incurring an undesirable amount of excess loss. For example, a 0.1 mm gap has been found to result in a 0.03 dB loss in the optical signal. As the gap size increases, the optical loss increases on a linear basis. The ability to quickly and inexpensively insert the nano-wire optical block in the hollow metallized waveguide can provide significant cost savings in manufacturing and testing.

In another embodiment, the PIN diode 306 (FIG. 3*a*) that comprises each properly formed nano-wire in a nano-wire optical block 300 can be reversed biased. Under reverse bias, a photon from the optical signal in the hollow metal waveguide that interacts with the intrinsic region of the PIN diode can generate charge carriers within the region. The reverse bias field can sweep the carriers out of the intrinsic region and create a detectable current. Thus, the reverse biased nano-wire optical block can act as a photodetector. In a reverse biased nano-wire optical block, each properly formed PIN diode can have a radius that is less than a wavelength of the optical signal in the hollow metallized waveguide to minimize interference with the optical signal.

A strong interaction is typically desired between the PIN diode 306 nano-wires and the optical signal. This may be obtained by using a nano-wire grid array 308, as illustrated in exemplary embodiments in FIGS. 3*a*-3*f*. When using nano-wires with diameters less than the wavelength of the light, only a portion of the light is typically absorbed. The grid array can cause multiple reflections of the optical signal to occur, thereby generating a plurality of electron hole pairs and enabling strong interaction between the nano-wires and the optical signal. When used as a detector, the nano-wires may be spaced a distance greater than a wavelength of the optical signal.

Figure 5:
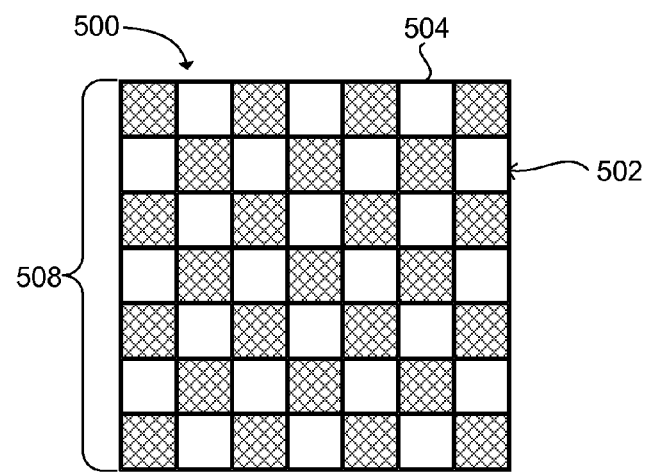
FIG. 5 is an illustration of a nano-wire optical block detector having a nano-wire gird array with substantially open areas in accordance with an embodiment of the present invention.

In one exemplary embodiment, illustrated in FIG. 5, a selected number of areas 502 can be left substantially open in a reverse biased nano-wire optical block detector 500 having a nano-wire gird array 508. The substantially open areas can have a reduced number of nano-wires or no nano-wires at all. This can allow a predetermined amount of the optical signal 108 to pass through the detector, thereby enabling a certain amount of the optical signal to be detected and the remaining portion of the optical signal to continue to propagate within the hollow metallized waveguide 100.

Figure 6:
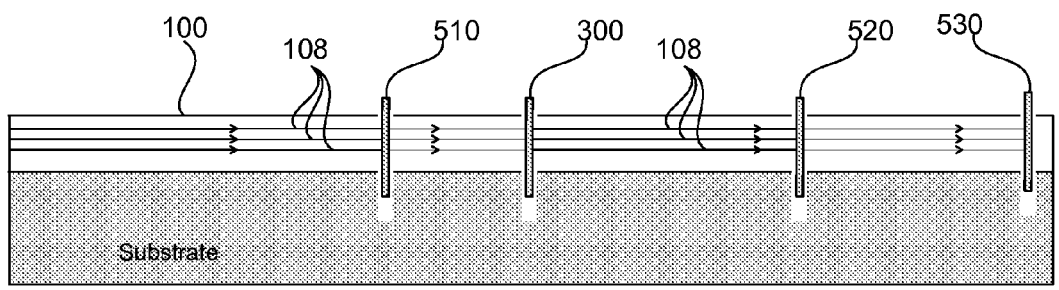
FIG. 6 is an illustration of a large core hollow metallized waveguide with nano-wire optical blocks configured for amplification and detection of an optical signal inserted in slots in the waveguide in accordance with an embodiment of the present invention.

In one embodiment, the ratio of open areas 502 relative to the total number of areas in the nano-wire grid array 508 can be selected based on the location of the nano-wire optical block detector 500 in the waveguide 100. For example, as illustrated in the exemplary embodiment of FIG. 6, a first detector 510 may include 90% open areas and 10% of areas including nano-wires. The next detector 520 may include 60% open areas and 40% of areas including nano-wires. The following detector may include 30% open areas and 70% of areas including nano-wires, and so forth. A last detector 530 may include 100% of areas including nano-wires. As the optical signal becomes weaker, a greater number of detectors can be used to detect the optical signal. In one embodiment, both detector blocks 500 and amplifier blocks 300 may be used in the same waveguide. Alternatively, only detectors may be inserted in a waveguide.

Figure 7A:
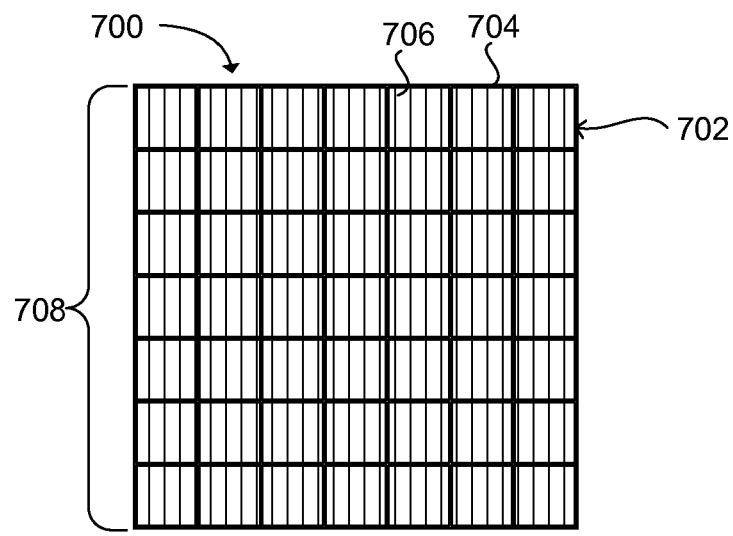
FIG. 7a is an illustration of a nano-wire optical block detector having a nano-wire gird array with a relatively low density of nano-wires in each area of the nano-wire grid array in accordance with an embodiment of the present invention.
Figure 7B:
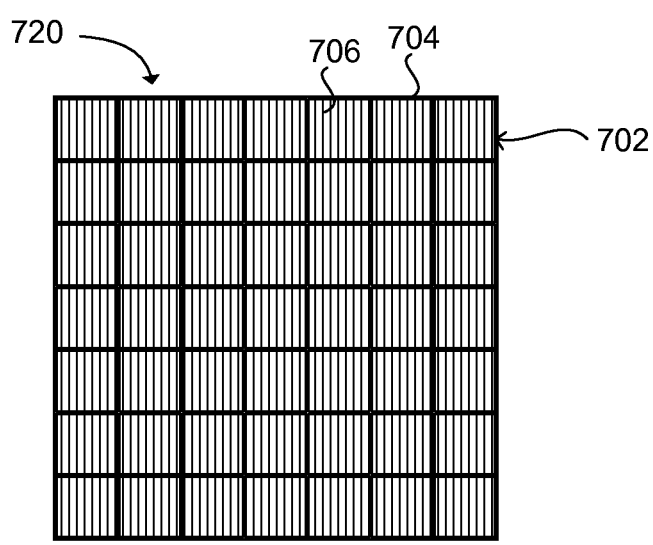
FIG. 7b is an illustration of a nano-wire optical block detector having a nano-wire gird array with a relatively high density of nano-wires in each area of the nano-wire grid array in accordance with an embodiment of the present invention.

In another exemplary embodiment a first detector 700, illustrated in FIG. 7*a*, may be formed with substantially each area 702 having a relatively low number of nano-wires 706. Unlike nano-wire blocks that are used as amplifiers, a reverse biased nano-wire optical block detector 700 can have nano-wires that are spaced a distance that is greater than a wavelength of the optical signal in the hollow metallized waveguide. For example, a nano-wire optical block detector 700 may have as few as one nano-wire per area 702 in the array 708, though typically each area would include at least several nano-wire detectors. Additionally, the type of material from which the PIN diodes are made can be selected to be partially light transmissive. A second nano-wire optical block detector having an increased density of nano-wires can be located after the first detector. Each following detector can have an increased density of nano-wires to enable detection of an increasingly small optical signal. In one embodiment, a last detector 720, as illustrated in FIG. 7*b*, may include a sufficient density of nano-wires in each area of the grid array to provide a substantially maximized area for detection.

The use of a nano-wire optical block as a detector in a hollow metallized waveguide can provide significant advantages over the use of splitters to detect a selected portion of an optical signal. For example, the block can be easily inserted in a slot in the hollow metallized waveguide and is fairly tolerant of the insertion angle. In contrast, a splitter is typically inserted at an angle with a relatively high degree of precision to allow the optical signal to be reflected at a desired angle. The block can be inserted at a 90 degree angle relative to the optical signal direction, thereby enabling a large number of detectors to be inserted in a short area. In contrast, a splitter is typically inserted at a 45 degree angle, thereby taking up a larger footprint in a waveguide. The block also directly detects the optical signal and converts it to an electrical signal that can be used directly in electrical chips and devices. A splitter typically uses additional lenses and components to direct the optical signal and convert it to an electrical signal. Thus, the nano-wire optical block can provide significant cost reductions with a reduced number of components, a simpler assembly process, and larger tolerances than are required for other optical components such as splitters.

In another embodiment, a nano-wire optical block, such as the detector 720, may be used as an optical modulator. In one embodiment, the nano-wire optical block can act as an electro-absorption type modulator. The PIN diodes 706 in the optical block 720 can be reverse biased sufficiently to shift the band gap of the active region to control its absorption of the incident light beam. The biasing signal can be modulated at a high rate, such as greater than 10 GHz, to provide an amplitude modulated optical signal capable of transmission rates of greater than 10 gigabits per second.

Figure 8:
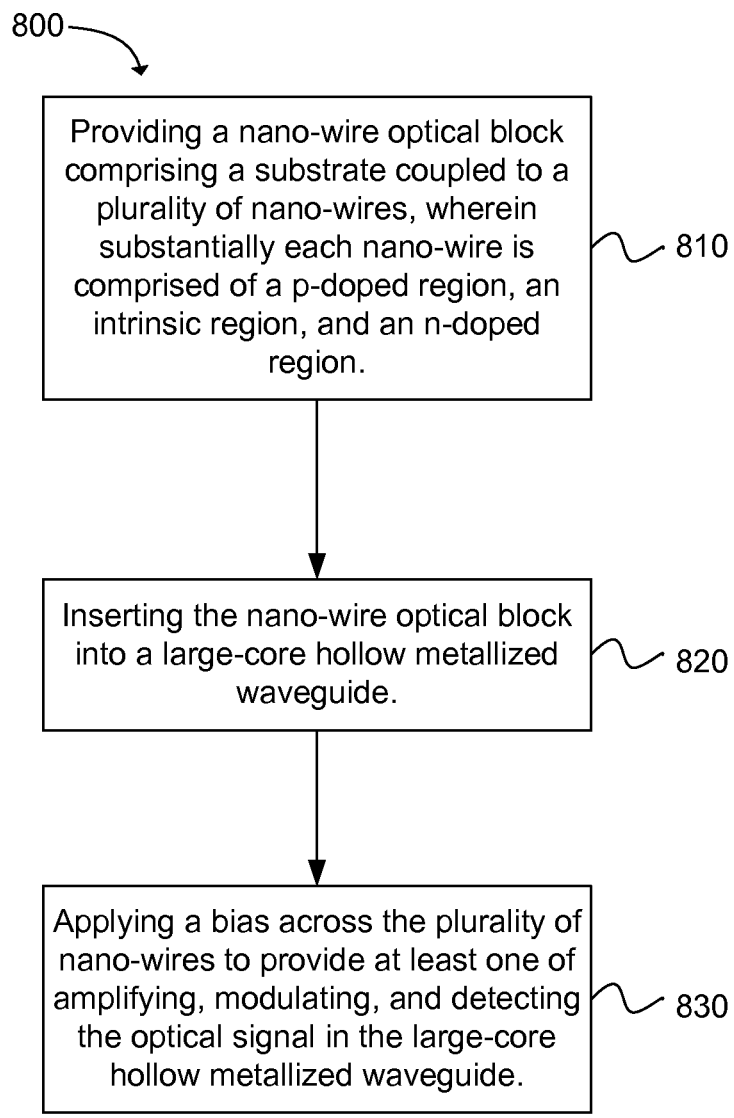
FIG. 8 is a flow chart depicting a method for amplifying, modulating, and detecting an optical signal in a large-core hollow metallized waveguide.

In another embodiment, a method 800 for amplifying, modulating, and detecting an optical signal in a large-core hollow metallized waveguide is disclosed, as depicted in the flow chart of FIG. 8. The method includes the operation of providing 810 a nano-wire optical block comprising a substrate that is coupled to a plurality of nano-wires. Each properly formed nano-wire is comprised of a p-doped region, an intrinsic region, and an n-doped region, as previously discussed. An additional operation involves inserting 820 the nano-wire optical block into a large-core hollow metallized waveguide. The block can be inserted into a slot in the waveguide and bonded in place using an adhesive, solder, or another bonding method. Another operation includes applying 830 a bias across the plurality of nano-wires to provide at least one of amplifying, modulating, and detecting the optical signal in the large-core hollow metallized waveguide.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A nano-wire optical block device for amplifying, modulating, and detecting an optical signal in a large-core hollow metallized waveguide comprising:
   a substrate; and a plurality of nano-wires coupled to the substrate to form the nano-wire optical block, wherein substantially each nano-wire is comprised of a p-doped region, an intrinsic region, and an n-doped region;

wherein the nano-wire optical block is operable to be inserted into the large-core hollow metallized waveguide to provide at least one of amplifying, modulating, and detecting the optical signal wherein the large-core hollow metallized waveguide comprises a bore extending along an axial direction from a given end to another end of the large-core hollow metallized waveguide.

2. The device of claim 1, wherein the substrate is comprised of an array of nano-wire grids, with each grid having at least one nano-wire and the spacing between each grid is less than a wavelength of the optical signal.

3. The device of claim 1, wherein each of the plurality of nano-wires has a dimension less than a wavelength of the optical signal.

4. The device of claim 1, wherein each of the plurality of nano-wires are spaced apart a distance that is less a wavelength of the optical signal.

5. The device of claim 1, wherein the plurality of nano-wires are formed from a III-V material.

6. The device of claim 1, wherein the intrinsic region is configured as a quantum well.

7. A system comprising:
the device of claim 1; and
a light source coupled to the large-core hollow metallized waveguide to provide the optical signal.

8. The system of claim 7, wherein the nano-wire optical block amplifies, modulates, and detects the optical signal.

9. The device of claim 1, wherein a given set of nano-wires of the plurality of nano-wires are oriented in a given direction and another set of nano-wires of the plurality of nano-wires are oriented in another direction.

10. The device of claim 9, wherein the given and other directions are perpendicular.

11. The device of claim 1, wherein a cross-sectional shape of the large-core hollow metallized waveguide is one of rectangular, round and elliptical.

12. The device of claim 1, wherein each of the plurality of nano-wires extend along a surface of the substrate.

13. The device of claim 1, wherein each of the plurality of nano-wires extend away from the substrate at a non-zero angle.

14. The device of claim 1, wherein the plurality of nano-wires are substantially parallel.

15. The device of claim 1, wherein the plurality of nano-wires are aligned in a random manor, such that a given nano-wire of the plurality of nano-wires and another nano-wire of the plurality of nano-wires are skewed.

16. The device of claim 1, further comprising a frame divided into a plurality of areas, wherein at least one of the areas of the plurality of areas comprises a plurality of nano-wires and at least one of the areas of the plurality of areas comprises a void.

17. The device of claim 1, further comprising a frame divided into a plurality of areas, wherein at least one of the areas of the plurality of areas comprises a plurality of nano-wires with a given bandgap and at least one of the areas of the plurality of areas comprises a plurality of nano-wires with another bandgap.

* * * * *

UNITED STATES PATENT AND TRADEMARK OFFICE
CERTIFICATE OF CORRECTION

PATENT NO. : 8,873,893 B2  
APPLICATION NO. : 13/002884  
DATED : October 28, 2014  
INVENTOR(S) : Sagi Varghese Mathai et al.

Page 1 of 1

It is certified that error appears in the above-identified patent and that said Letters Patent is hereby corrected as shown below:

In the Claims

In column 12, line 18, in Claim 15, delete "manor," and insert -- manner, --, therefor.

Signed and Sealed this
Fourteenth Day of April, 2015

Michelle K. Lee
*Director of the United States Patent and Trademark Office*